(12) United States Patent
Wang et al.

(10) Patent No.: US 9,118,371 B2
(45) Date of Patent: Aug. 25, 2015

(54) DIGITAL TRANSMITTER AND METHOD FOR COMPENSATING MISMATCH IN DIGITAL TRANSMITTER

(71) Applicant: MEDIATEK INC., Hsin-Chu (TW)

(72) Inventors: Chi-Hsueh Wang, Kaohsiung (TW); Yang-Chuan Chen, Chiayi County (TW); Hsiang-Hui Chang, Miaoli County (TW); Li-Shin Lai, Taipei (TW); Khurram Muhammad, Winston-Salem, NC (US)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/281,916

(22) Filed: May 20, 2014

(65) Prior Publication Data

US 2014/0348265 A1 Nov. 27, 2014

Related U.S. Application Data

(60) Provisional application No. 61/825,630, filed on May 21, 2013.

(51) Int. Cl.
| | |
|---|---|
| *H04K 1/02* | (2006.01) |
| *H04B 1/04* | (2006.01) |
| *H04L 25/08* | (2006.01) |
| *H03F 3/217* | (2006.01) |
| *H03F 3/24* | (2006.01) |
| *H03G 3/00* | (2006.01) |

(52) U.S. Cl.
CPC .......... *H04B 1/0475* (2013.01); *H03F 3/2178* (2013.01); *H03F 3/24* (2013.01); *H03G 3/002* (2013.01); *H04L 25/08* (2013.01); *H04B 2001/045* (2013.01)

(58) Field of Classification Search
CPC ........... H04L 5/00; H04L 15/00; H04L 17/00; H04L 27/367; H04B 1/00; H04B 3/00; H04B 5/00; H04B 7/00; H04B 10/00; H04B 13/00; H04B 14/00; H04B 15/00; H03F 1/3241
USPC .......... 375/295, 297, 341, 294, 215, 375–376
See application file for complete search history.

(56) References Cited

U.S. PATENT DOCUMENTS

| | | | | |
|---|---|---|---|---|
| 5,955,980 | A * | 9/1999 | Hanna | 341/120 |
| 6,094,082 | A * | 7/2000 | Gaudet | 327/270 |
| 6,137,833 | A | 10/2000 | Lange | |
| 6,671,652 | B2 * | 12/2003 | Watson et al. | 702/177 |
| 6,897,794 | B2 * | 5/2005 | Kuyel et al. | 341/120 |
| 6,996,378 | B2 * | 2/2006 | Helms | 455/91 |
| 7,142,998 | B2 * | 11/2006 | Watson et al. | 702/69 |
| 7,443,323 | B2 * | 10/2008 | Rotchford et al. | 341/120 |
| 7,535,392 | B2 * | 5/2009 | Weng et al. | 341/143 |
| 7,724,862 | B2 * | 5/2010 | Menolfi et al. | 375/376 |
| 7,852,245 | B2 * | 12/2010 | Sutardja | 341/120 |
| 8,154,432 | B2 * | 4/2012 | Kaper et al. | 341/120 |

(Continued)

*Primary Examiner* — Emmanuel Bayard
(74) *Attorney, Agent, or Firm* — Winston Hsu; Scott Margo

(57) ABSTRACT

A digital transmitter includes: a plurality of converting devices arranged to generate a plurality of converting signals according to a plurality of digital input signals; a compensation device arranged to generate at least one compensation signal according to the plurality of digital input signals; and a combining circuit arranged to output an amplified output signal according to the plurality of converting signals and the at least one compensation signal.

21 Claims, 7 Drawing Sheets

(56) References Cited

U.S. PATENT DOCUMENTS

| | | | |
|---|---|---|---|
| 8,219,343 B2* | 7/2012 | Lin | 702/89 |
| 8,471,743 B2* | 6/2013 | Huang | 341/143 |
| 8,514,012 B2* | 8/2013 | Splithof et al. | 327/552 |
| 8,599,983 B2* | 12/2013 | Sidiropoulos et al. | 375/355 |
| 8,669,794 B2* | 3/2014 | Park et al. | 327/156 |
| 8,878,711 B1* | 11/2014 | Loeda Pagliano | 341/143 |
| 2002/0050372 A1 | 5/2002 | Lee | |
| 2006/0244649 A1* | 11/2006 | Terazawa et al. | 341/155 |
| 2007/0230615 A1 | 10/2007 | Taylor | |
| 2008/0290938 A1 | 11/2008 | Gupta | |
| 2011/0074398 A1* | 3/2011 | Barton et al. | 324/133 |
| 2011/0187433 A1* | 8/2011 | Baumann et al. | 327/276 |
| 2011/0227770 A1 | 9/2011 | Kaper | |
| 2012/0268184 A1* | 10/2012 | Baumann et al. | 327/277 |
| 2012/0275544 A1 | 11/2012 | Midya | |
| 2013/0043920 A1* | 2/2013 | Lee et al. | 327/159 |
| 2013/0099951 A1 | 4/2013 | Kopa | |
| 2013/0113557 A1 | 5/2013 | Hongo | |
| 2013/0135127 A1* | 5/2013 | Siragusa | 341/110 |

\* cited by examiner

| 201_1 | 201_2 | 201_3 | |
|---|---|---|---|
| D_n | 0 | 0 | 202_n |
|  | 1 | C_n |  |
| D_(n-1) | 0 | 0 | 202_(n-1) |
|  | 1 | C_(n-1) |  |
| D_(n-2) | 0 | 0 |  |
|  | 1 | C_(n-2) |  |
| ⋮ | ⋮ | ⋮ | |
| D_3 | 0 | 0 | 202_3 |
|  | 1 | C_3 |  |
| D_2 | 0 | 0 | 202_2 |
|  | 1 | C_2 |  |
| D_1 | 0 | 0 | 202_1 |
|  | 1 | C_1 |  |

DIGITAL TRANSMITTER AND METHOD FOR COMPENSATING MISMATCH IN DIGITAL TRANSMITTER

CROSS REFERENCE TO RELATED APPLICATIONS

This application claims the benefit of U.S. Provisional Application No. 61/825,630, which was filed on May 21, 2013 and is included herein by reference.

BACKGROUND

The present invention relates to a digital transmitter and a method for compensating mismatch in a digital transmitter, and more particularly to a low noise and low cost digital transmitter and related compensation method.

In wireless communication system, using a digital transmitter to digitally amplify and transmit RF (Radio Frequency) signal can be the most area saving and power efficient way. Conventionally, there have two ways to implement the digital transmitter. The first type is thermo-coding, and the second type is binary-coding. For the thermo-coding digital transmitter, the output power is a combination of a plurality of unit powers outputted by a plurality of unit cells. Therefore, a thermo-coding digital transmitter may need a lots of unit cells to generate a high power output signal. On the other hand, the binary-coding digital transmitter uses a plurality of binary-coding cells to generate an amplified output signal. The number of the binary-coding cells is less than the number of unit cells of the thermo-coding digital transmitter because the binary-coding cell may generate power higher than the unit power of the thermo-coding digital transmitter. The areas of the binary-coding cells should be well-defined to output their corresponding powers. In practical, however, the semiconductor process may somehow cause the mismatch occurs in the unit cells or binary-coding cells, and consequently affect the performance of the digital transmitter.

Therefore, how to solve the cell mismatch problem of a digital transmitter is an urgent problem in the field of wireless communication system.

SUMMARY

One objective of the present embodiment is to provide a low noise and low cost digital transmitter and related compensation method.

According to a first embodiment of the present invention, a digital transmitter is disclosed. The digital transmitter comprises a plurality of converting devices, a compensation device, and a combining circuit. The plurality of converting devices are arranged to generate a plurality of converting signals according to a plurality of digital input signals. The compensation device is arranged to generate at least one compensation signal according to the plurality of digital input signals. The combining circuit is arranged to output an amplified output signal according to the plurality of converting signals and the at least one compensation signal.

According to a second embodiment of the present invention, a method for compensating a digital transmitter is disclosed. The method comprises the steps: using a plurality of converting devices for generating a plurality of converting signals according to a plurality of digital input signals; generating at least one compensation signal according to the plurality of digital input signals; and outputting an amplified output signal according to the plurality of converting signals and the at least one compensation signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a diagram illustrating a look-up table according to an embodiment of the present invention.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
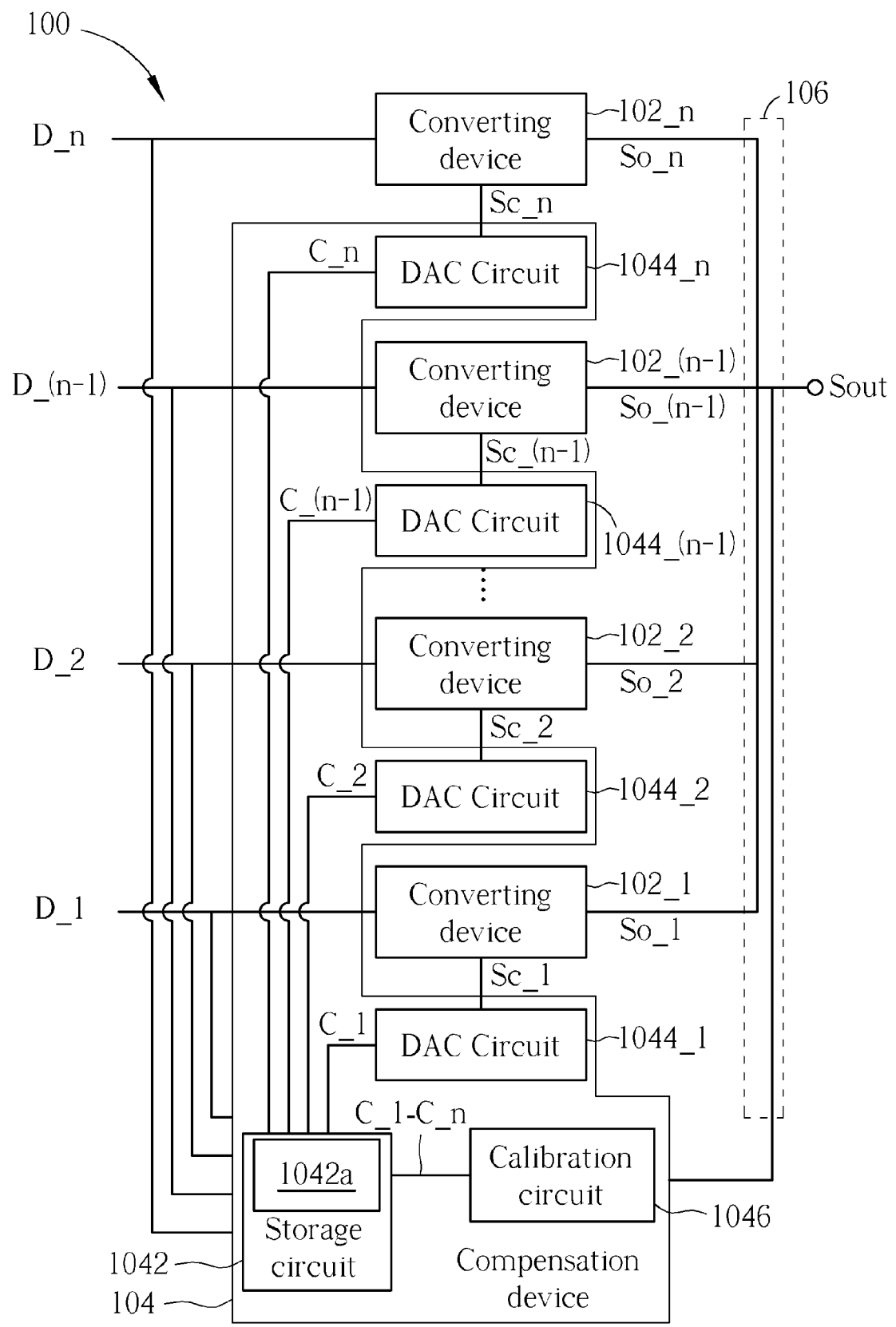
FIG. 1 is a diagram illustrating a digital transmitter according to a first embodiment of the present invention.

Please refer to FIG. 1, which is a diagram illustrating a digital transmitter 100 according to a first embodiment of the present invention. For illustration purpose, FIG. 1 particularly focuses on an output stage of a digital transmitter, and therefore some circuits of the digital transmitter may be omitted here. The digital transmitter 100 comprises a plurality of converting devices 102_1-102_$n$, a compensation device 104, and a combining circuit 106. The plurality of converting devices 102_1-102_$n$ are arranged to generate a plurality of converting signals So_1-So_n according to a plurality of digital input signals D_1-D_n respectively. The compensation device 104 is arranged to generate a plurality of compensation signals Sc_1-Sc_n according to the plurality of digital input signals D_1-D_n respectively. The combining circuit 106 is arranged to output an amplified output signal Sout according to the plurality of converting signals So_1-So_n and the plurality of compensation signals Sc_1-Sc_n.

The compensation device 104 comprises a storage circuit 1042, a plurality of digital to analog converting (DAC) circuits 1044_1-1044_$n$, and a calibration circuit 1046. The storage circuit 1042 is arranged to store a look-up table 1042$a$, wherein the look-up table 1042$a$ records a plurality of compensation values C_1-C_$n$ corresponding to the plurality of converting devices 102_1-102_$n$ respectively. The plurality of digital to analog converting circuits 1044_1-1044_$n$ are coupled to the plurality of converting devices 102_1-102_n for generating the plurality of compensation signals Sc_1-Sc_n according to the plurality of compensation values C_1-C_n respectively. The calibration circuit 1046 is arranged to generate the look-up table 1042a including the plurality of compensation values C_1-C_n. For example, the calibration circuit 1046 selects at least one converting device of the plurality of converting devices 102_1-102_n to be a reference converting device, and calibrates the plurality of converting devices 102_1-102_n to generate the plurality of compensation values C_1-C_n according to the reference converting device.

Following takes the binary coding scheme as an example to explain the proposed compensation mechanism. More specifically, according to the present embodiment, the plurality of digital input signals D_1-D_n are a plurality of binary-coding digital bits respectively, wherein the digital input signal D_1 is the least significant bit (LSB) and the digital input signal D_n is the most significant bit (MSB) in the binary-coding digital bits. Therefore, the significances of the plurality of digital input signals D_1-D_n are orderly increased from D_1 to D_n. The plurality of binary-coding converting devices 102_1-102_n are arranged to generate the plurality of converting signals So_1-So_n having powers of $P*2^0$, $P*2^1$, $P*2^2$, ..., $P*2^{(n-1)}$ respectively when plurality of binary-coding converting devices 102_1-102_n are turned on individually, in which P is the power of the converting signal So_1 generated by the converting device 102_1. Therefore, ideally, the areas of the plurality of binary-coding converting devices 102_1-102_n should also be $A*2^0$, $A*2^1$, $A*2^2$, ..., $A*2^{(n-1)}$ respectively in order to generate the above mentioned powers, in which A is the area of the converting device 102_1. However, in practice, the semiconductor process may cause the areas of the plurality of binary-coding converting devices 102_1-102_n to deviate from their respective sizes. Accordingly, the nonlinearity effect occurs in the amplified output signal Sout if no compensation is applied to the plurality of binary-coding converting devices 102_1-102_n. In other words, the mismatches between the respective areas of the plurality of binary-coding converting devices 102_1-102_n may degrade the noise floor of the amplified output signal Sout.

Therefore, the present compensation device 104 is aimed on calibrate the effect caused by the area mismatches of the plurality of binary-coding converting devices 102_1-102_n such that the powers of the plurality of converting signals So_1-So_n having powers of $P*2^0$, $P*2^1$, $P*2^2$, ..., $P*2^{(n-1)}$ respectively.

When the digital transmitter 100 is fabricated by the semiconductor process, the data in the look-up table 1042a is not built up yet. Therefore, the compensation device 104 is arranged to buildup the data of the look-up table 1042a first. According to this embodiment, the calibration circuit 1046 first selects the least significant converting device (i.e. 102_1) in the plurality of binary-coding converting devices 102_1-102_n to be the reference binary-coding converting device, and to calibrate the plurality of binary-coding converting devices 102_1-102_n to generate the plurality of compensation values C_1-C_n by referencing to the reference binary-coding converting device. As the least significant converting device 102_1 is the reference binary-coding converting device, the least significant converting device 102_1 is not calibrated, i.e. C_1=0. Therefore, the first DAC 1044_1 may be an optional device for the digital transmitter 100. In other words, if one (or more) binary-coding converting device s selected to be the reference binary-coding converting device, then the selected one (or more) binary-coding converting device is not calibrated, and the corresponding compensation DAC circuit is also not necessary.

In this embodiment, when the least significant converting device 102_1 is the reference binary-coding converting device, the least significant converting device 102_1 is first arranged to generate twice power, i.e. 2*P, of the converting signal So_1 corresponding to the digital input signal D_1 with the value of bit 1. It is noted that the twice power 2*P of the converting signal So_1 can be generated by the least significant converting device 102_1 in conjunction with a duplicate of the least significant converting device 102_1 (not shown in FIG. 1). The calibration circuit 1046 detects and records the twice power 2*P of the converting signal So_1.

Then, only the second converting device 102_2 (i.e. the higher significant converting device) is turned on to generate the second converting signal So_2 corresponding to the second digital input signal D_2 with the value of bit 1. The calibration circuit 1046 detects and records the power P2 of the second converting signal So_2. Then, the calibration circuit 1046 compares the power P2 of the second converting signal So_2 with the power 2*P. If the power P2 of the second converting signal So_2 is different from the power 2*P, the calibration circuit 1046 adjusts the second compensation value C_2 and controls the second DAC 1044_2 to generate the second compensation signal Sc_2 to the second converting device 102_2 according to the second compensation value C_2 until the power summation of the second converting signal So_2 and the second compensation signal Sc_2 equal to the power 2*P. In this embodiment, the second converting device 102_2 is intentionally designed to have lower power than the power 2*P such that the second DAC 1044_2 can provide the shortage of power to the second converting device 102_2 via the second compensation signal Sc_2. However, this is not the limitation of the present invention. Moreover, the calibration circuit 1046 may apply the SAR (Successive Approximation Register) algorithm with binary search to find out the second compensation value C_2, and this is also not the limitation of the present invention.

When the power summation of the second converting signal So_2 and the second compensation signal Sc_2 equal to the power 2*P, the calibration circuit 1046 records the corresponding second compensation value C_2 into the row 202_2 in the look-up table 1042a as shown in FIG. 2, which is a diagram illustrating the look-up table 1042a according to an embodiment of the present invention. In the look-up table 1042a, the first column 201_1 records the plurality of digital input signals D_1-D_n of the plurality of binary-coding converting devices 102_1-102_n respectively. The second column 201_2 records the bit values (i.e. 0 or 1) of the plurality of digital input signals D_1-D_n. The third column 201_3 records the plurality of compensation values C_1-C_n corresponding to the bit values of the plurality of digital input signals D_1-D_n respectively. It can be seen that when the bit value of a digital input signal is 0, the corresponding compensation value is also 0. The compensation value only works on when the bit value of a digital input signal is 1. This is because when the bit value of a digital input signal is 0, the corresponding converting device is turned off.

Back to previous paragraph, when the second compensation value C_2 is determined by the calibration circuit 1046, the calibration goes onto the third converting device 102_3. The goal is to calibrate the power P3 of the third converting signal So_3 to equal the quadruple power, i.e. $P*2^2$, of the converting signal So_1. To determine the third compensation value C_3, only the third converting device 102_3 (i.e. the higher significant converting device) is turned on to generate the third converting signal So_3 corresponding to the third digital input signal D_3 with the value of bit 1. The calibration circuit 1046 detects and records the power P3 of the third converting signal So_3. Then, the calibration circuit 1046 compares the power P3 of the third converting signal So_3 with the power summation (i.e. 2*P+2*P=4*P) of the twice power of the first converting signal So_1 and the calibrated second converting signal So_2. If the power P3 of the third converting signal So_3 is different from the power 4*P, the calibration circuit 1046 adjusts the third compensation value C_3 and controls the third DAC 1044_3 to generate the third compensation signal Sc_3 to the third converting device 102_3 according to the third compensation value C_3 until the power summation of the third converting signal So_3 and the third compensation signal Sc_3 equal to the power 4*P. Similarly, the third converting device 102_3 is intentionally designed to have lower power than the power 4*P such that the third DAC 1044_3 can provide the shortage of power to the third converting device 102_3 via the second compensation signal Sc_2.

When the power summation of the third converting signal So_3 and the third compensation signal Sc_3 equal to the power 4*P, the calibration circuit 1046 records the corresponding third compensation value C_3 into the row 202_3 in the look-up table 1042a as shown in FIG. 2.

Accordingly, by using the similar method, the rest of the converting devices 102_4-102_n can be calibrated to have powers of $P*2^3, \ldots, P*2^{(n-1)}$ respectively. The corresponding compensation values C_4-C_n are obtained and recorded into the look-up table 1042a. Therefore, after the calibration performed to the plurality of binary-coding converting devices 102_1-102_n, the powers of the plurality of calibrated converting signals So_1-So_n are $P*2^0, P*2^1, P*2^2, \ldots, P*2^{(n-1)}$ respectively.

It should be noted that the above embodiment selects the least significant converting device 102_1 to be the reference binary-coding converting device. However, this is not the limitation of the present invention. In another embodiment, the most significant converting device 102_n can also be selected to be the reference binary-coding converting device. If the most significant converting device 102_n is selected to be the reference binary-coding converting device, the most significant converting device 102_n is first arranged to generate a power $2^{(n-1)}*P$ of the converting signal So_n corresponding to the digital input signal D_n with the value of bit 1. The calibration circuit 1046 detects and records the power $2^{(n-1)}*P$ of the converting signal So_n.

Then, only the next converting device 102_(n-1) (i.e. the lower significant converting device) is turned on to generate the converting signal So_(n-1) corresponding to the digital input signal D_(n-1) with the value of bit 1. The calibration circuit 1046 detects and records the power P(n-1) of the converting signal So_(n-1). Then, the calibration circuit 1046 compares the power P(n-1) of the converting signal So_(n-1) with a half of the power $2^{(n-1)}*P$, i.e. $2^{(n-2)}*P$. If the power P(n-1) of the converting signal So_(n-1) is different from the power $2^{(n-2)}*P$, the calibration circuit 1046 adjusts the compensation value C_(n-1) and controls the DAC 1044_(n-1) to generate the compensation signal Sc_(n-1) to the converting device 102_(n-1) according to the compensation value C_(n-1) until the power summation of the converting signal So_(n-1) and the compensation signal Sc_(n-1) equal to the power $2^{(n-2)}*P$.

When the power summation of the converting signal So_(n-1) and the compensation signal Sc_(n-1) equal to the power $2^{(n-2)}*P$, the calibration circuit 1046 records the corresponding compensation value C_(n-1) into the row 202_(n-1) in the look-up table 1042a as shown in FIG. 2.

When the compensation value C_(n-1) is determined by the calibration circuit 1046, the calibration goes on to the next converting device 102_(n-2). The goal is to calibrate the power P(n-2) of the converting signal So_(n-2) to equal a half of the power $2^{(n-2)}*P$, i.e. $2^{(n-3)}*P$, of the converting signal So_(n-1). To determine the compensation value C_(n-2), only the converting device 102_(n-2) is turned on to generate the converting signal So_(n-2). The calibration circuit 1046 detects and records the power P(n-2) of the converting signal So_(n-2). Then, the calibration circuit 1046 compares the power P(n-2) of the converting signal So_(n-2) with the half of the power (i.e. $2^{(n-3)}*P$) of the calibrated converting signal So_(n-1). If the power P(n-2) of the third converting signal So_3 is different from the power $2^{(n-3)}*P$, the calibration circuit 1046 adjusts the compensation value C_(n-2) and controls the DAC 1044_(n-2) to generate the compensation signal Sc_(n-2) to the converting device 102_(n-2) according to the compensation value C_(n-2) until the power of the converting signal So_(n-2) equal to the power $2^{(n-3)}*P$.

When the power of the converting signal So_(n-2) and the compensation signal Sc_(n-2) equal to the power $2^{(n-3)}*P$, the calibration circuit 1046 records the corresponding compensation value C_(n-2) into the row 202_(n-2) in the look-up table 1042a as shown in FIG. 2. Accordingly, by using the similar method, the rest of the converting devices 102_(n-3)-102_1 can be calibrated to have powers of $P*2^{(n-4)}, \ldots, P*2^0$ respectively. The corresponding compensation values C_(n-3)-C_1 are obtained and recorded into the look-up table 1042a. Therefore, after the calibration performed to the plurality of binary-coding converting devices 102_1-102_n, the powers of the plurality of calibrated converting signals So_1-So_n are $P*2^0, P*2^1, P*2^2, \ldots, P*2^{(n-1)}$ respectively.

After the calibration, the look-up table 1042a stores the compensation values C_n-C_1 corresponding to the converting devices 102_n-102_1 respectively. When the digital transmitter 100 is under operating to amplify the plurality of digital input signals D_1-D_n, the plurality of DAC circuits 1044_1-1044_n refer to the bit values (i.e. 0 or 1) of the plurality of digital input signals D_1-D_n to selectively output the corresponding compensation signals Sc_1-Sc_n. More specifically, if the bit value of a digital input signal is 1, then the corresponding DAC circuit outputs the corresponding compensation signal to the corresponding converting device. If the bit value of a digital input signal is 0, then the corresponding DAC circuit may not output the corresponding compensation signal to the corresponding converting device. It should be noted that the compensation values C_1-C_n can be changed based on temperature or other factors. Therefore, another independent algorithm can be applied to adjust the compensation values C_1-C_n over temperature.

Figure 3:
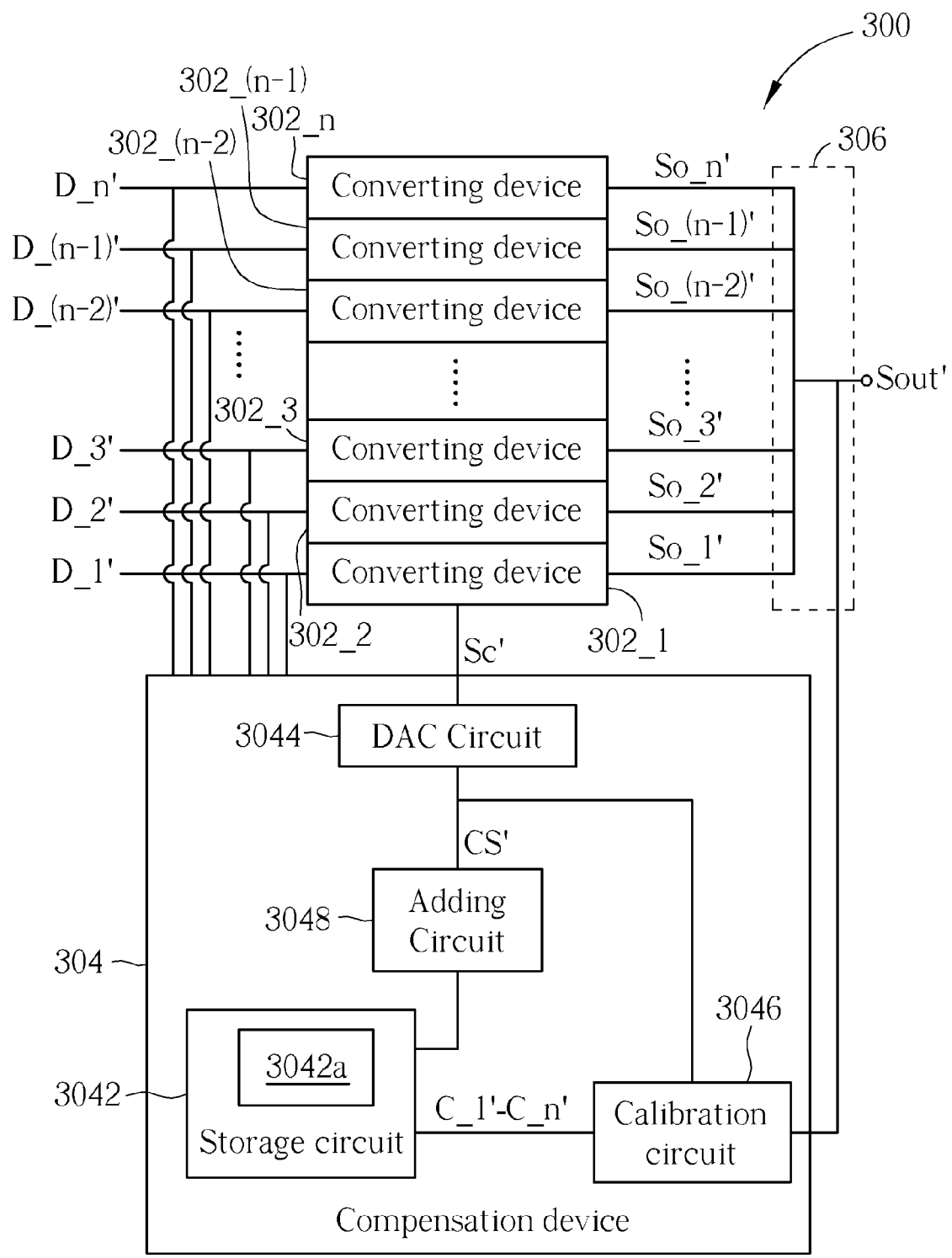
FIG. 3 is a diagram illustrating a digital transmitter according to a second embodiment of the present invention.

Please refer to FIG. 3, which is a diagram illustrating a digital transmitter 300 according to a second embodiment of the present invention. For illustration purpose, FIG. 3 particularly focuses on an output stage of a digital transmitter, and therefore some circuits of the digital transmitter may be omitted here. The digital transmitter 300 comprises a plurality of converting devices 302_1-302_n, a compensation device 304, and a combining circuit 306. The plurality of converting devices 302_1-302_n are arranged to generate a plurality of converting signals So_1'-So_n' according to a plurality of digital input signals D_1'-D_n' respectively. The compensation device 304 is arranged to generate a compensation signal Sc' according to the plurality of digital input signals D_1'-D_n'. The combining circuit 306 is arranged to output an amplified output signal Sout' according to the plurality of converting signals So_1'-So_n' and the compensation signal Sc'.

The compensation device 304 comprises a storage circuit 3042, a digital to analog converting (DAC) circuit 3044, a calibration circuit 3046, and an adding circuit 3048. The storage circuit 3042 is arranged to store a look-up table 3042a, wherein the look-up table 3042a records a plurality of compensation values C_1'-C_n' corresponding to the plurality of converting devices 302_1-302_n respectively. The adding circuit 3048 is arranged to adding up the values of the plurality of compensation values C_1'=-C_n' to generate a total compensation value CS' according to the plurality of digital input signals D_1'-D_n'. The digital to analog converting circuit 3044 is arranged to generate the compensation signal Sc' according to the total compensation value CS', wherein the amplified output signal Sout' is a summation of the plurality of converting signals So_1'-So_n' and the compensation signal Sc'. The DAC circuit 3044 may be a duplicate DAC of a part of the plurality of converting devices 302_1-302_n. The calibration circuit 3046 is arranged to generate the look-up table 3042a including the plurality of compensation values C_1'-C_n'. For example, the calibration circuit 1046 selects at least one converting device of the plurality of converting devices 302_1-302_n to be a reference converting device, and to calibrate the plurality of converting devices 302_1-302_n to generate the plurality of compensation values C_1'-C_n' according to the reference converting device.

Following takes the binary coding scheme as an example to explain the compensation mechanism.

Similarly, the present compensation device 304 is aimed on calibrate the effect caused by the area mismatches of the plurality of binary-coding converting devices 302_1-302_n such that the powers of the plurality of converting signals So_1'-So_n' having powers of $P'*2^0$, $P'*2^1$, $P'*2^2$, ..., $P'*2^{(n-1)}$ respectively.

When the digital transmitter 300 is fabricated by the semiconductor process, the data in the look-up table 3042a is not built up yet. Therefore, the compensation device 304 is arranged to buildup the data of the look-up table 3042a first. According to this embodiment, the calibration circuit 3046 first selects the least significant converting device (i.e. 302_1) in the plurality of binary-coding converting devices 302_1-302_n to be the reference binary-coding converting device, and to calibrate the plurality of binary-coding converting devices 302_1-302_n to generate the plurality of compensation values C_1'-C_n' by referencing to the reference binary-coding converting device. As the least significant converting device 302_1 is the reference binary-coding converting device, the least significant converting device 302_1 is not calibrated, i.e. C_1'=0. In other words, if one (or more) binary-coding converting device s selected to be the reference binary-coding converting device, then the selected one (or more) binary-coding converting device is not calibrated.

In this embodiment, when the least significant converting device 302_1 is the reference binary-coding converting device, the least significant converting device 302_1 is first arranged to generate twice power, i.e. 2*P', of the converting signal So_1' corresponding to the digital input signal D_1' with the value of bit 1. It is noted that the twice power 2*P' of the converting signal So_1' can be generated by the least significant converting device 302_1 in conjunction with a duplicate of the least significant converting device 302_1 (not shown in FIG. 3). The calibration circuit 3046 detects and records the twice power 2*P' of the converting signal So_1'.

Then, only the second converting device 302_2 (i.e. the higher significant converting device) is turned on to generate the second converting signal So_2' corresponding to the second digital input signal D_2' with the value of bit 1. The calibration circuit 3046 detects and records the power P2' of the second converting signal So_2'. Then, the calibration circuit 3046 compares the power P2' of the second converting signal So_2' with the power 2*P'. If the power P2' of the second converting signal So_2' is different from the power 2*P', the calibration circuit 3046 adjusts the second compensation value C_2' and controls the DAC 3044 to generate the compensation signal Sc' to the second converting device 302_2 according to the second compensation value C_2' until the power summation of the second converting signal So_2' and the compensation signal Sc' equal to the power 2*P'. In this embodiment, the second converting device 302_2 is intentionally designed to have lower power than the power 2*P' such that the DAC 3044 can provide the shortage of power to the second converting device 302_2 via the compensation signal Sc'. However, this is not the limitation of the present invention. Moreover, the calibration circuit 3046 may apply the SAR (Successive Approximation Register) algorithm with binary search to find out the compensation value C_2', and this is also not the limitation of the present invention.

When the power summation of the second converting signal So_2' and the compensation signal Sc' equal to the power 2*P', the calibration circuit 3046 records the corresponding second compensation value C_2' in the look-up table 3042a. The look-up table 3042a is similar to the look-up table 1042a as shown in FIG. 2, thus the detailed description is omitted here for brevity.

When the second compensation value C_2' is determined by the calibration circuit 3046, the calibration goes on to the third converting device 302_3. Similarly, the goal is to calibrate the power P3' of the third converting signal So_3' to equal the quadruple power, i.e. $P'*2^2$, of the converting signal So_1'. To determine the third compensation value C_3', only the third converting device 302_3 (i.e. the higher significant converting device) is turned on to generate the third converting signal So_3' corresponding to the third digital input signal D_3' with the value of bit 1. The calibration circuit 3046 detects and records the power P3' of the third converting signal So_3'. Then, the calibration circuit 3046 compares the power P3' of the third converting signal So_3' with the power summation (i.e. 2*P'+2*P'=4*P') of the twice power of the first converting signal So_1' and the calibrated second converting signal So_2'. If the power P3' of the third converting signal So_3' is different from the power 4*P', the calibration circuit 3046 adjusts the third compensation value C_3' and controls the DAC 3044 to generate the compensation signal Sc' to the third converting device 302_3 according to the third compensation value C_3' until the power summation of the third converting signal So_3' and the compensation signal Sc' equal to the power 4*P'. Similarly, the third converting device 302_3 is intentionally designed to have lower power than the power 4*P' such that the DAC 3044 can provide the shortage of power to the third converting device 302_3 via the compensation signal Sc'.

When the power summation of the third converting signal So_3' and the compensation signal Sc' equal to the power 4*P', the calibration circuit 3046 records the corresponding third compensation value C_3' into the look-up table 3042a as shown in FIG. 2.

Accordingly, by using the similar method, the rest of the converting devices 302_4-302_n can be calibrated to have powers of $P'*2^3$, ..., $P'*2^{(n-1)}$ respectively. The corresponding compensation values C_4'-C_n' are obtained and recorded into the look-up table 3042a. Therefore, after the calibration performed to the plurality of binary-coding converting devices 302_1-302_n, the powers of the plurality of calibrated converting signals So_1'-So_n' are P'*2⁰, P'*2¹, P'*2², . . . , P'*2^(n-1) respectively.

It should be noted that the above embodiment selects the least significant converting device 302_1 to be the reference binary-coding converting device. However, this is not the limitation of the present invention. In another embodiment, the most significant converting device 302_n can also be selected to be the reference binary-coding converting device. Similar to the digital transmitter 100, if the most significant converting device 302_n is selected to be the reference binary-coding converting device, the calibration starts on the converting device 302_(n−1), and then orderly goes on to the lower significant converting devices 302_(n−2)-302_1. As the calibration is similar to the calibration of the digital transmitter 100, the detailed description is omitted here brevity.

After the calibration, the look-up table 3042a stores the compensation values C_1'-C_n' corresponding to the converting devices 302_1-302_n respectively. When the digital transmitter 300 is under operating to amplify the plurality of digital input signals D_1'-D_n', the adding circuit 3048 refers the bit values (i.e. 0 or 1) of the plurality of digital input signals D_1'-D_n' to select a plurality of compensation values from the look-up table 3042a, and then adds up the plurality of compensation values to generate the total compensation value CS' to the DAC circuit 3044. More specifically, the adding circuit 3048 only selects and adds up the compensation values corresponding to the digital input signals with bit values of 1. Then, the DAC 3044 generates the compensation signal Sc' according to the total compensation value CS'. In this embodiment, the compensation signal Sc' is combined with the plurality of converting signals So_1'-So_n' to generate the amplified output signal Sout'. It should be noted that the compensation values C_1'-C_n' can be changed based on temperature or other factors. Therefore, another independent algorithm can be applied to adjust the compensation values C_1'-C_n' over temperature.

Figure 4:
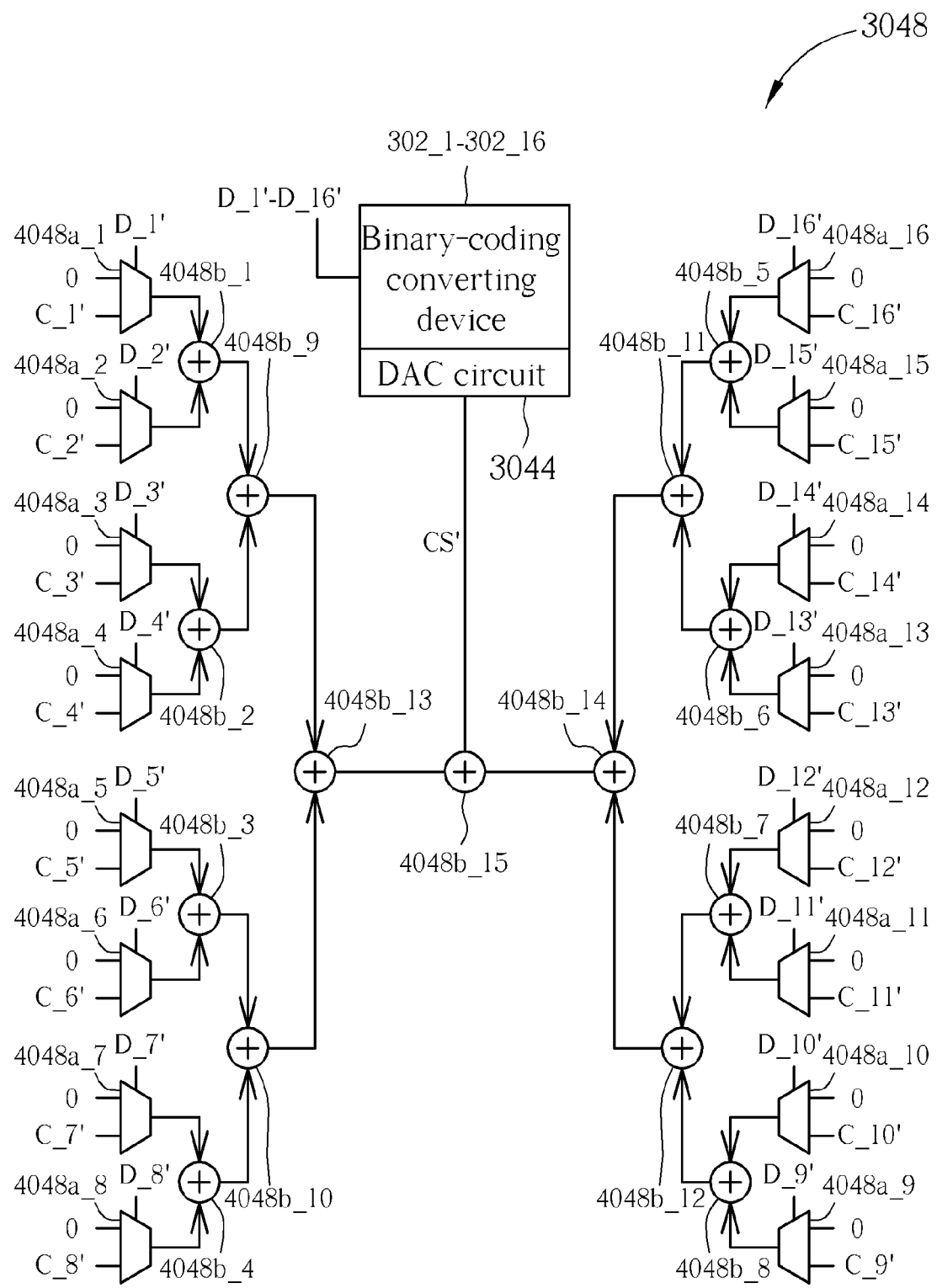
FIG. 4 is a diagram illustrating a plurality of binary-coding converting devices, a DAC circuit, and an adding circuit according to an embodiment of the present invention.

Please refer to FIG. 4, which is a diagram illustrating the plurality of binary-coding converting devices 302_1-302_16, the DAC circuit 3044, and the adding circuit 3048 according to an embodiment of the present invention. In the embodiment, the adding circuit 3048 comprises a plurality of multiplexers 4048a_1-4048a_16, and a plurality of adders 4048b_1-4048b_15. The plurality of multiplexers 4048a_1-4048a_16 are controlled by the plurality of digital input signals D_1'-D_16' respectively. The plurality of multiplexers 4048a_1-4048a_16 are arranged to receive the compensation values C_1'-C_16' respectively. Each multiplexer has two input terminals, wherein one terminal receives the value 0, and the other terminal receives a corresponding compensation value. When the bit value of a digital input signal is 1, the corresponding multiplexer outputs the corresponding compensation value. Otherwise, the corresponding multiplexer outputs the value 0. Then, the plurality of adders 4048b_1-34048b_15 are arranged to adds up the compensation values corresponding to the digital input signals with bit values of 1 to generate the total compensation value CS'.

Figure 5:
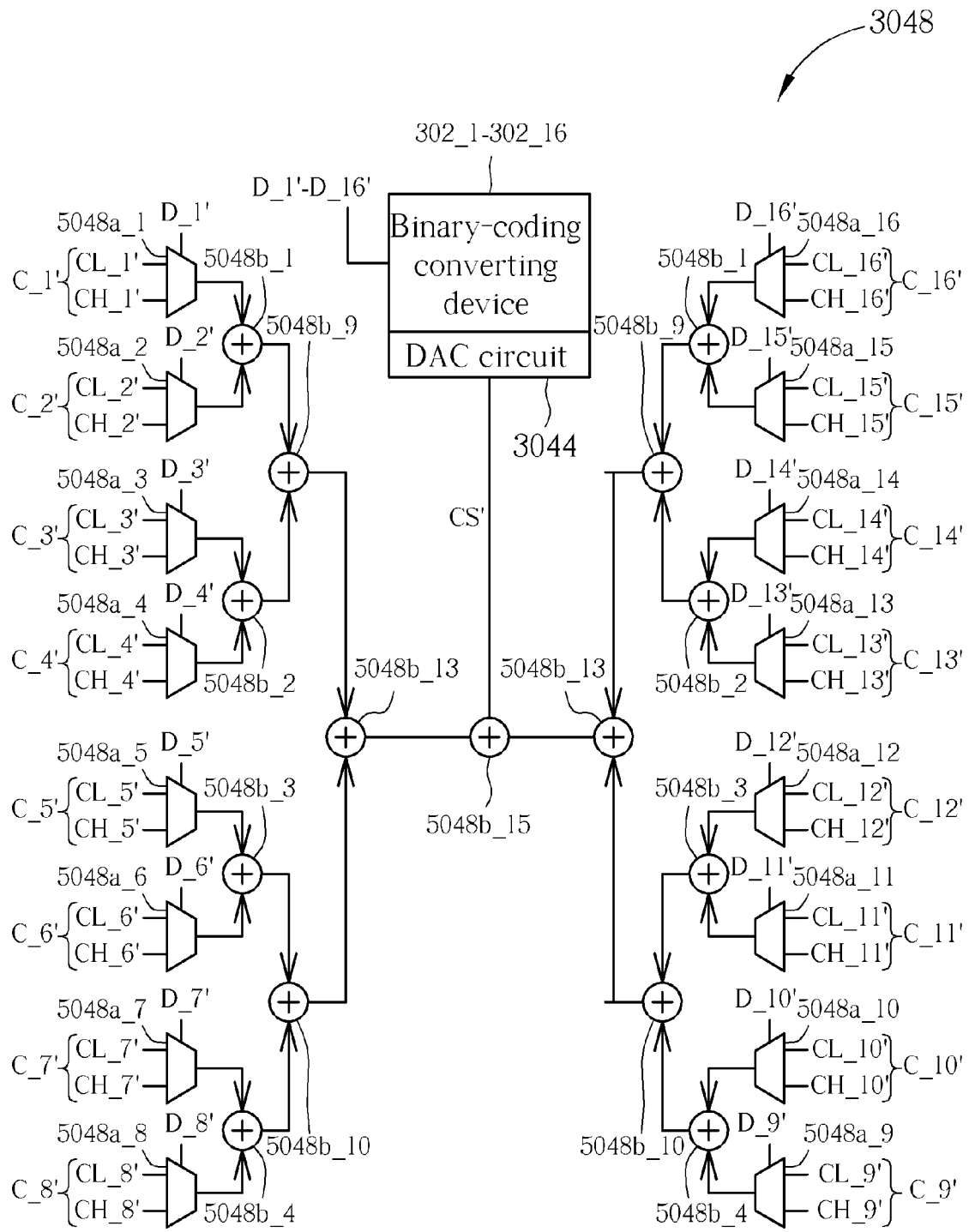
FIG. 5 is a diagram illustrating a plurality of binary-coding converting devices, a DAC circuit, and an adding circuit according to another embodiment of the present invention.

Please refer to FIG. 5, which is a diagram illustrating the plurality of binary-coding converting devices 302_1-302_16, the DAC circuit 3044, and the adding circuit 3048 according to another embodiment of the present invention. In the embodiment, the adding circuit 3048 comprises a plurality of multiplexers 5048a_1-5048a_16, and a plurality of adders 5048b_1-5048b_15. The plurality of multiplexers 5048a_1-5048a_16 are controlled by the plurality of digital input signals D_1'-D_16' respectively. The plurality of multiplexers 5048a_1-5048a_16 are arranged to receive the compensation values C_1'-C_16' of the plurality of binary-coding converting devices 302_1-302_16 respectively. In this embodiment, each compensation value comprises two different values. In other words, the compensation value C_1' comprises the first value CL_1' and the second value CH_1', the compensation value C_2' comprises the first value CL_2' and the second value CH_2', and so on. The first value is the compensation value when the bit value of a digital input signal changes to 1 from 0. The second value is the compensation value when the bit value of a digital input signal changes to 0 from 1.

For example, when the digital transmitter 300 is under operating, and when the bit value of the digital input signal D_1 changes to 1 from 0, the multiplexer 5048a_1 outputs the first value CL_1' to be the compensation value of the converting device 302_1. When the bit value of the digital input signal D_1 changes to 0 from 1, the multiplexer 5048a_1 outputs the second value CH_1' to be the compensation value of the converting device 302_1. By doing this, the glitch problem induced by the DAC circuit 3044 can be decreased. Then, the plurality of adders 5048b_1-5048b_15 are arranged to adds up the compensation values outputted by the plurality of multiplexers 5048a_1-5048a_16 to generate the total compensation value CS'.

Figure 6:
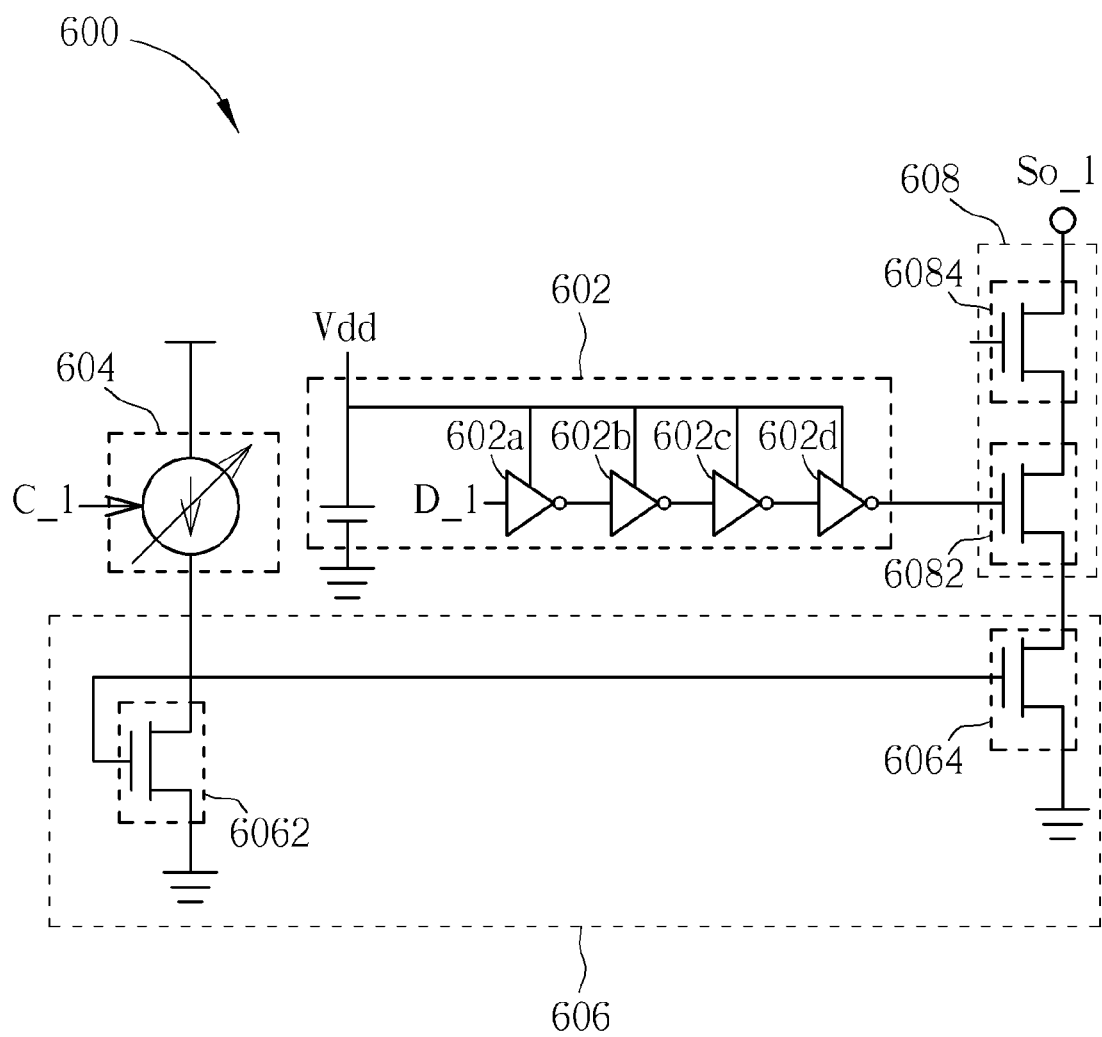
FIG. 6 is a diagram illustrating a binary-coding converting device according to an embodiment of the present invention.

Please refer to FIG. 6, which is a diagram illustrating a binary-coding converting device 600 according to an embodiment of the present invention. The binary-coding converting device 600 is applicable for the above mentioned digital transmitter 100 and 300. The binary-coding converting device 600 comprises an input stage 602, an adjustable current source 604, a current mirror 606, and an output stage 608. The input stage 602 comprises a plurality of inverters 602a-602d connected in series. The input stage 602 is arranged to receive a digital input signal (e.g. D_1). The current mirror 606 comprises a diode-connected field effect transistor 6062 and a field effect transistor 6064. The output stage 608 comprises a field effect transistor 6082 and a field effect transistor 6084 connected in cascoded. The connectivity between the input stage 602, the adjustable current source 604, the current mirror 606, and the output stage 608 are shown in FIG. 6, thus the detailed description is omitted here for brevity.

According to the embodiment as shown in FIG. 6, the adjustable current source 604 is adjusted by the compensation value (e.g. C_1) stored in the above mentioned look-up table (e.g. 1042a). The output stage 608 is arranged to output a converting signal (e.g. So_1) according to the compensation value and the digital input signal. When the digital transmitter (e.g. 100) performs the above mentioned calibration, the adjustable current source 604 is adjusted until the converting signal (e.g. So_1) to have the predetermined power. As the power of the converting signal (e.g. So_1) can be adjusted by increasing the current I or decreasing the current I of the adjustable current source 604, the calibration process could be executed from small bit (i.e. lower significant converting device) to large bit (i.e. higher significant converting device) or from large bit to small bit.

Figure 7:
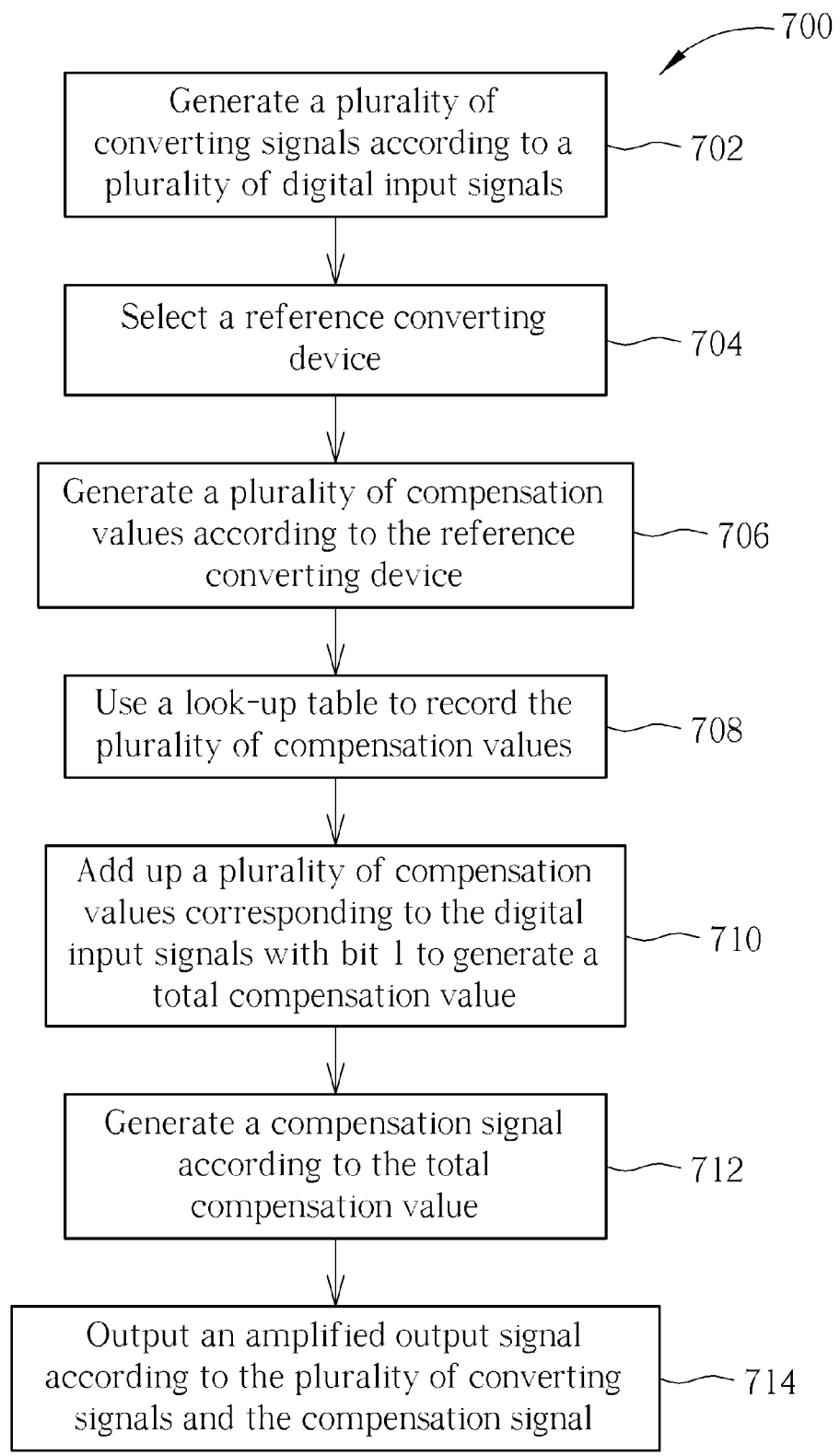
FIG. 7 is a flowchart illustrating a method for compensating a digital transmitter according to an embodiment of the present invention.

In summary, the calibration of the above mentioned digital transmitter can be summarized into the steps of FIG. 7. FIG. 7 is a flowchart illustrating a method 700 for compensating a digital transmitter (100 or 300) according to an embodiment of the present invention. For brevity, the method 700 is described in conjunction with the digital transmitter 300. Provided that substantially the same result is achieved, the steps of the flowchart shown in FIG. 7 need not be in the exact order shown and need not be contiguous, that is, other steps can be intermediate. The method 700 comprises:

Step 702: Use the plurality of converting devices 302_1-302_n for generating a plurality of converting signals So_1'-So_n' according to a plurality of digital input signals D_1'-D_n';

Step 704: Select at least one converting device of the plurality of converting devices 302_1-302_n to be a reference converting device;

Step 706: Calibrate the plurality of converting devices 302_1-302_n to generate the plurality of compensation values C_1'-C_n' according to the reference converting device;

Step 708: Use the look-up table 3042a to record the plurality of compensation values C_1'-C_n' corresponding to the plurality of converting devices 302_1-302_n respectively;

Step 710: Add up a plurality of compensation values corresponding to the digital input signals with bit 1 to generate the total compensation value CS' according to the plurality of digital input signals;

Step 712: Generate the compensation signal Sc' according to the total compensation value CS'; and Step 714: Output the amplified output signal Sout' according to the plurality of converting signals So_1'-So_n' and the compensation signal Sc'.

Briefly, according to the description of the about embodiments, the present invention solves the nonlinear problem arises from the mismatches between the areas of the plurality of converting devices. The present invention uses an auxiliary small DAC (e.g. 3044) to generate a compensation signal to compensate the powers of the plurality of converting signals. The present calibration process is to continuously compare two cell groups (e.g. two binary-coding converting devices) following SAR algorithm. The comparing process is done by using a feedback detection loop (e.g. the compensation device). Accordingly, the present invention has the advantages of high accuracy and high resolution. The present invention is also simple to be implemented. The area and current consumption of the present digital transmitter are small either.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital transmitter, comprising:
   a plurality of converting devices, arranged to generate a plurality of converting signals according to a plurality of digital input signals;
   a compensation device, arranged to generate at least one compensation signal according to the plurality of digital input signals; and
   a combining circuit, arranged to output an amplified output signal according to the plurality of converting signals and the at least one compensation signal.

2. The digital transmitter of claim 1, wherein the compensation device comprises:
   a storage circuit, arranged to store a look-up table, wherein the look-up table records a plurality of compensation values corresponding to the plurality of converting devices respectively.

3. The digital transmitter of claim 2, wherein the compensation device further comprises:
   an adding circuit, arranged to adding up the plurality of compensation values to generate a total compensation value.

4. The digital transmitter of claim 3, wherein the compensation device further comprises:
   a digital to analog converting circuit, arranged to generate the at least one compensation signal according to the total compensation value;
   wherein the amplified output signal is a summation of the plurality of converting signals and the at least one compensation signal.

5. The digital transmitter of claim 2, wherein the at least one compensation signal comprises a plurality of compensation signals, and the compensation device further comprises:
   a plurality of digital to analog converting circuits, coupled to the plurality of converting devices respectively, for generating the plurality of compensation signals according to the plurality of compensation values respectively.

6. The digital transmitter of claim 5, wherein the amplified output signal is a summation of the plurality of converting signals and the plurality of compensation signals.

7. The digital transmitter of claim 2, wherein the compensation device further comprises:
   a calibration circuit, arranged to generate the look-up table.

8. The digital transmitter of claim 1, wherein at least one converting device of the plurality of converting devices is selected to be a reference converting device, and the plurality of converting devices are calibrated to generate the plurality of compensation values according to the reference converting device.

9. The digital transmitter of claim 8, further comprising a duplicate of the reference converting device.

10. The digital transmitter of claim 8, wherein when the reference converting device is a least significant converting device in the plurality of converting devices, the calibration circuit uses a power of the converting signal generated by the least significant converting device to be a reference power, and refers the reference power to determine the plurality of compensation values for calibrating powers of a plurality of more significant converting signals generated by a plurality of more significant converting devices in the plurality of converting devices such that the powers of the plurality of more significant converting signals are $P*2^n$ respectively, wherein P is the reference power, n is a positive integer.

11. The digital transmitter of claim 8, wherein when the reference converting device is a most significant converting device in the plurality of converting devices, the calibration circuit uses a power of the converting signal generated by the most significant converting device to be a reference power, and refers the reference power to determine the plurality of compensation values for calibrating powers of a plurality of less significant converting signals generated by a plurality of less significant converting devices in the plurality of converting devices such that the powers of the plurality of less significant converting signals are $P*2^{-n}$ respectively, wherein P is the reference power, n is a positive integer.

12. A method for compensating a digital transmitter, comprising:
   using a plurality of converting devices for generating a plurality of converting signals according to a plurality of digital input signals;
   generating at least one compensation signal according to the plurality of digital input signals; and
   outputting an amplified output signal according to the plurality of converting signals and the at least one compensation signal.

13. The method of claim 12, wherein the step of generating the at least one compensation signal according to the plurality of digital input signals further comprises:

using a look-up table to record a plurality of compensation values corresponding to the plurality of converting devices respectively.

14. The method of claim 13, wherein the step of generating the at least one compensation signal according to the plurality of digital input signals further comprises:
adding up the plurality of compensation values to generate a total compensation value according to the plurality of digital input signals.

15. The method of claim 14, wherein the step of generating the at least one compensation signal according to the plurality of digital input signals further comprises:
generating the at least one compensation signal according to the total compensation value;
wherein the amplified output signal is a summation of the plurality of converting signals and the at least one compensation signal.

16. The method of claim 13, wherein the at least one compensation signal comprises a plurality of compensation signals, and the step of generating the at least one compensation signal according to the plurality of digital input signals further comprises:
generating the plurality of compensation signals according to the plurality of compensation values respectively.

17. The method of claim 16, wherein the amplified output signal is a summation of the plurality of converting signals and the plurality of compensation signals.

18. The method of claim 13, wherein the step of generating the at least one compensation signal according to the plurality of digital input signals further comprises:
selecting at least one converting device of the plurality of converting devices to be a reference converting device; and
calibrating the plurality of converting devices to generate the plurality of compensation values according to the reference converting device.

19. The method of claim 18, further comprising providing a duplicate of the reference converting device.

20. The method of claim 18, wherein the reference converting device is a least significant converting device in the plurality of converting devices, and the step of calibrating the plurality of converting devices to generate the plurality of compensation values according to the reference converting device comprises:
using a power of the converting signal generated by the least significant converting device to be a reference power; and
referring the reference power to determines the plurality of compensation values for calibrating powers of a plurality of more significant converting signals generated by a plurality of more significant converting devices in the plurality of converting devices such that the powers of the plurality of more significant converting signals are $P*2^n$ respectively;
wherein P is the reference power, n is a positive integer.

21. The method of claim 18, wherein the reference converting device is a most significant converting device in the plurality of converting devices, and the step of calibrating the plurality of converting devices to generate the plurality of compensation values according to the reference converting device comprises:
using a power of the converting signal generated by the most significant converting device to be a reference power; and
referring the reference power to determine the plurality of compensation values for calibrating powers of a plurality of less significant converting signals generated by a plurality of less significant converting devices in the plurality of converting devices such that the powers of the plurality of less significant converting signals are $P*2^{-n}$ respectively;
wherein P is the reference power, n is a positive integer.

* * * * *